US012796390B2

(12) United States Patent
Ceballos et al.

(10) Patent No.: US 12,796,390 B2
(45) Date of Patent: Nov. 10, 2026

(54) ELECTROSTATIC CHUCK COVER PIECE TO ENABLE PROCESSING OF DIELECTRIC SUBSTRATES

(71) Applicant: Applied Materials, Inc., Santa Clara, CA (US)

(72) Inventors: Andrew Ceballos, Palo Alto, CA (US); Suraj Yadav, San Jose, CA (US); Kazuya Daito, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 528 days.

(21) Appl. No.: 18/349,006

(22) Filed: Jul. 7, 2023

(65) Prior Publication Data

US 2024/0011147 A1 Jan. 11, 2024

Related U.S. Application Data

(60) Provisional application No. 63/359,544, filed on Jul. 8, 2022.

(51) Int. Cl.
*H10P 72/72* (2026.01)
*H10P 72/76* (2026.01)

(52) U.S. Cl.
CPC ........ *H10P 72/722* (2026.01); *H10P 72/7611* (2026.01); *H10P 72/7612* (2026.01); *H10P 72/7614* (2026.01); *H10P 72/7624* (2026.01)

(58) Field of Classification Search
CPC .............. H10P 72/7611; H10P 72/7612; H10P 72/7614; H10P 72/7624; H10P 72/722
See application file for complete search history.

(56) References Cited

U.S. PATENT DOCUMENTS

| | | | |
|---|---|---|---|
| 9,188,397 B2 | 11/2015 | Jindo et al. | |
| 9,539,801 B2 | 1/2017 | Canale et al. | |
| 10,854,431 B2 | 12/2020 | Koshiishi et al. | |
| 2009/0209112 A1* | 8/2009 | Koelmel | H10P 72/0436 438/795 |
| 2012/0264051 A1 | 10/2012 | Angelov et al. | |
| 2016/0079039 A1 | 3/2016 | Dhindsa et al. | |
| 2016/0086775 A1 | 3/2016 | Forster et al. | |
| 2016/0329230 A1 | 11/2016 | Raj et al. | |
| 2019/0111541 A1* | 4/2019 | Boyd, Jr. | B24B 37/14 |
| 2021/0343557 A1 | 11/2021 | Rasheed et al. | |
| 2022/0157575 A1 | 5/2022 | Kitamura | |

OTHER PUBLICATIONS

PCT/US2023/027146, International Search Report and Written Opinion dated Nov. 7, 2023, 14 pages.

* cited by examiner

*Primary Examiner* — Alan Snyder
(74) *Attorney, Agent, or Firm* — Patterson + Sheridan, LLP

(57) ABSTRACT

Apparatus for processing a semiconductor substrate are described herein. The apparatus include an electrostatic chuck within a physical vapor deposition process chamber. The electrostatic chuck is covered by a cover plate and has an edge ring disposed around the cover plate. The cover plate includes an alignment portion as well as a central support. An outer ring may extend from the cover plate to further support a substrate. A spacer is utilized to raise the edge ring to an appropriate height for processing of an optical device in the physical vapor deposition process chamber.

20 Claims, 6 Drawing Sheets

ELECTROSTATIC CHUCK COVER PIECE TO ENABLE PROCESSING OF DIELECTRIC SUBSTRATES

CROSS-REFERENCE TO RELATED APPLICATIONS

This application claims benefit of U.S. provisional patent application Ser. No. 63/359,544, filed Jul. 8 2022, which is herein incorporated by reference.

BACKGROUND

Field

Embodiments of the present disclosure generally relate to a cover plate for a semiconductor processing chamber. For example, aspects of the present disclosure are directed towards a cover plate for an electrostatic chuck within a physical vapor deposition (PVD) chamber for use during optical device and electronic device fabrication.

Description of the Related Art

Optical devices, such as waveguides, waveguide combiners, flat optical devices, metasurfaces, color-filters, and anti-reflective coatings, are formed using a plurality of different deposition, bake, and etch processes. During the formation of some optical devices, a substrate is positioned inside of a plasma process chamber, such as a reactive-ion etch (RIE) chamber, a physical vapor deposition (PVD) chamber, a plasma-enhanced atomic layer deposition (PEALD) chamber, or a plasma-enhanced chemical vapor deposition (PECVD) chamber. Within the RIE, PVD, PEALD, and PECVD chambers, the plasma density is affected by the patterns of conduction traces and insulators on the chuck surface and causes nonuniformities on the substrate.

Charge accumulation on the substrate is further unable to be dissipated when positioned on electrostatic chucks within plasma process chambers. Not being able to dissipate the charge accumulated on the substrate prevents the substrate from having an equipotential surface. The charge accumulation is further exacerbated by added AC bias on the pedestal. In some instances, charge accumulation has led to a substrate sticking to an electrostatic chuck after plasma processing and being broken during removal from the plasma process chamber.

In some instances, plasma chambers are retrofitted with a new substrate support pedestal before use to form optical devices. However, retrofitting with a new substrate support pedestal is expensive and typically takes several weeks to complete.

Therefore, what is described herein are apparatus and methods for enabling current plasma process chambers to be utilized for optical device processing with better process uniformity and less charge accumulation.

SUMMARY

The present disclosure generally relates to a substrate support assembly. The substrate support assembly is configured for use in a semiconductor processing chamber. The substrate support assembly includes a substrate support having a support surface and an outer lip surrounding the support surface. The support surface further includes a plurality of grooves, a central opening, a center tap, a plurality of dimples, and a plurality of lift pin openings. A cover plate is disposable over the support surface and includes a top surface, a bottom surface, an alignment protrusion extending from the bottom surface and into the central opening, and a plurality of openings formed from the top surface to the bottom surface and aligned with the plurality of lift pin openings. An edge ring is disposed around the top surface.

In another embodiment, a cover plate is described. The cover plate is configured to be placed on a substrate support pedestal in a semiconductor processing chamber. The cover plate includes a top surface, a bottom surface, an alignment protrusion extending from the bottom surface through a central axis of the cover plate, a plurality of lift pin openings formed from the top surface to the bottom surface and evenly spaced around the central axis, and a central support extending about 0.1 mm to about 1 mm above the top surface and through the central axis. The top surface of the cover plate is planar and unbroken from a radial distance of about 3 mm to about 80 mm from a central axis of the cover plate.

In yet another embodiment, a cover plate assembly is described. The cover plate assembly is configured to be placed on a substrate support pedestal in a semiconductor processing chamber. The cover plate assembly includes a cover plate, an edge ring, and a spacer. The cover plate includes a top surface, a bottom surface, an outer surface connecting the top surface and the bottom surface, an alignment protrusion extending from the bottom surface through a central axis of the cover plate, a plurality of lift pin openings formed from the top surface to the bottom surface and evenly spaced around the central axis, and a central support extending about 0.1 mm to about 1 mm above the top surface and through the central axis. The top surface of the cover plate is planar and unbroken from a radial distance of about 3 mm to about 80 mm from a central axis of the cover plate. The edge ring is disposed around the outer surface of the cover plate. The spacer is disposed underneath the edge ring and around the outer surface of the cover plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards a cover plate assembly utilized as part of a larger substrate support assembly. The cover plate assembly is utilized to retrofit a substrate support for use during optical device processing. When retrofitting the substrate support with a cover plate assembly similar to that described herein, the plasma process chamber has a reduced down time compared to a complete replacement of the substrate support assembly, such as one day as compared to several weeks. The cover plate assembly further reduces incidence of substrate sticking on the electrostatic chuck after a plasma process is performed by either providing a wide non-contact area or allowing dissipation of the charge over a wide area if a backside of the substrate is contacted by the cover plate. The cover plate further improves the uniformity of plasma density and reduces the amount of patterning caused by conduction traces and insulators within the electrostatic chuck.

The cover plate assembly includes each of a cover plate, a deposition ring, and a spacer. The spacer is positioned underneath the deposition ring to raise the deposition ring. The spacer is similar in height to the height of the cover plate. The cover plate is configured to have a substrate positioned thereon, such that the cover plate separates the substrate from the substrate support and the electrostatic chuck within the substrate support.

The cover plate assembly described herein is especially beneficial when utilized during processing of optical devices. Optical devices use dielectric substrates, such as quartz or sapphire substrates. Dielectric substrates have high amounts of charge accumulation compared to conventional semiconductor device substrates. Therefore, the use of the cover plate may assist in dissipating the charge accumulation.

Figure 1:
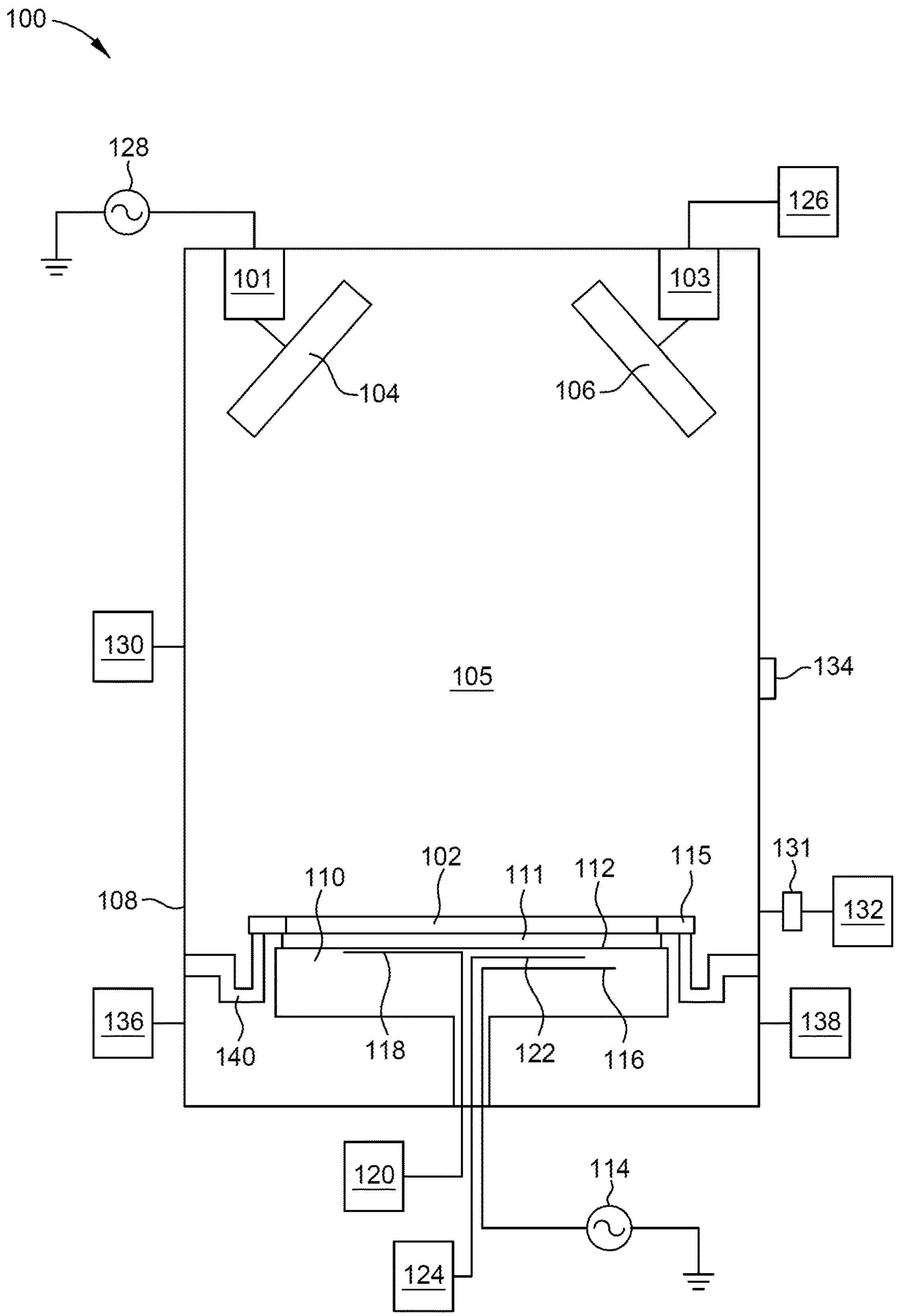
FIG. 1 is a schematic cross sectional view of a physical vapor deposition (PVD) process chamber, according to embodiments described herein.

FIG. 1 is a schematic cross sectional view of a physical vapor deposition (PVD) process chamber 100. It is to be understood that the PVD chamber 100 described below is an exemplary PVD chamber and other PVD chambers, including PVD chambers from other manufacturers, may be used with or modified to utilize the present disclosure.

The PVD chamber 100 is utilized to form optical devices on a substrate 102. The PVD chamber 100 is configured for utilization of a cover plate 111 which separates the substrate 102 from a substrate support 110. The PVD chamber 100 includes one or a plurality of cathodes. The cathodes may include at least one dielectric target cathode 101 and at least one optical device material target cathode 103 having a corresponding plurality of targets including at least one dielectric target 104 and at least one optical device material (e.g., metallic or semiconductor) target 106, attached to the chamber body 108. In some embodiments, at least one of the plurality of targets is a metal target with reactive sputtering. While FIG. 1 depicts one dielectric target 104 and one optical device material target 106, the PVD chamber 100 may include one or more dielectric targets 104 and/or one or more optical device material targets 106. For example, 3-5 targets selected from at least one of the dielectric targets 104 or the optical device material targets 106 may be included in the PVD chamber 100. In embodiments with the one or more dielectric targets 104 and the one or more optical device material targets 106, each dielectric target 104 is operable to deposit a different dopant material and/or each optical device material target 106 is operable to deposit a different optical device material.

The PVD chamber 100 is configured to include the substrate support 110 having a support surface 112 to support the cover plate 111 and the substrate 102. The PVD chamber 100 includes an opening 134 (e.g., a slit valve) through which the optical device substrate may enter a process volume 105 of the PVD chamber 100.

The substrate support 110 includes an RF bias power source 114 coupled to a bias electrode 116 disposed in the substrate support 110. The PVD chamber 100 includes a sputter gas source 136 that provides a sputter gas, such as argon (Ar). The PVD chamber 100 includes a reactive gas source 138 that provides a reactive gas, such as an oxygen-containing gas or a nitrogen-containing gas.

The substrate support 110 includes an edge ring 115, such as a deposition ring, which surrounds one or both of the cover plate 111 and a substrate, such as the substrate 102, on a support surface 112 of the substrate support 110. The substrate support 110 may also include an electrostatic chuck, a vacuum chuck, or the like. The edge ring 115 is disposed on top of a shield 140 within the PVD chamber 100.

The substrate support 110 is configured to include a cooling conduit 118 disposed in the substrate support 110 where the cooling conduit 118 controllably cools the substrate support 110, the cover plate 111, and the substrate 102 positioned thereon to a predetermined temperature, for example between about 20° C. to about 400° C. The cooling conduit 118 is coupled to a cooling fluid source 120 to provide cooling fluid. The substrate support 110 is further configured to include a heater 122 embedded therein. The heater 122, such as a resistive element, disposed in the substrate support 110 is coupled to an optional heater power source 124 and controllably heats the substrate support 110 and the optical device substrate 102 positioned thereon to a predetermined temperature, for example between about 30° C. to 300° C. Each target (e.g., dielectric target 104 or optical device material target 106) has a DC power source 126 or an RF power source 128 and an associated magnetron. The multiple power sources enable both DC powered processes and RF powered processes to occur in the same PVD chamber 100.

The PVD chamber 100 includes a process gas supply 130 to supply a predetermined process gas to the process volume 105 of the PVD chamber 100. For example, the process gas supply 130 supplies oxygen-containing gas to the process volume 105 to form an oxidizing environment in the process volume 105. The PVD chamber 100 may also include a precursor gas source 132 to supply a precursor gas, for example a gaseous dopant precursor, which is controlled by precursor gas flow controller 131.

Figure 2:
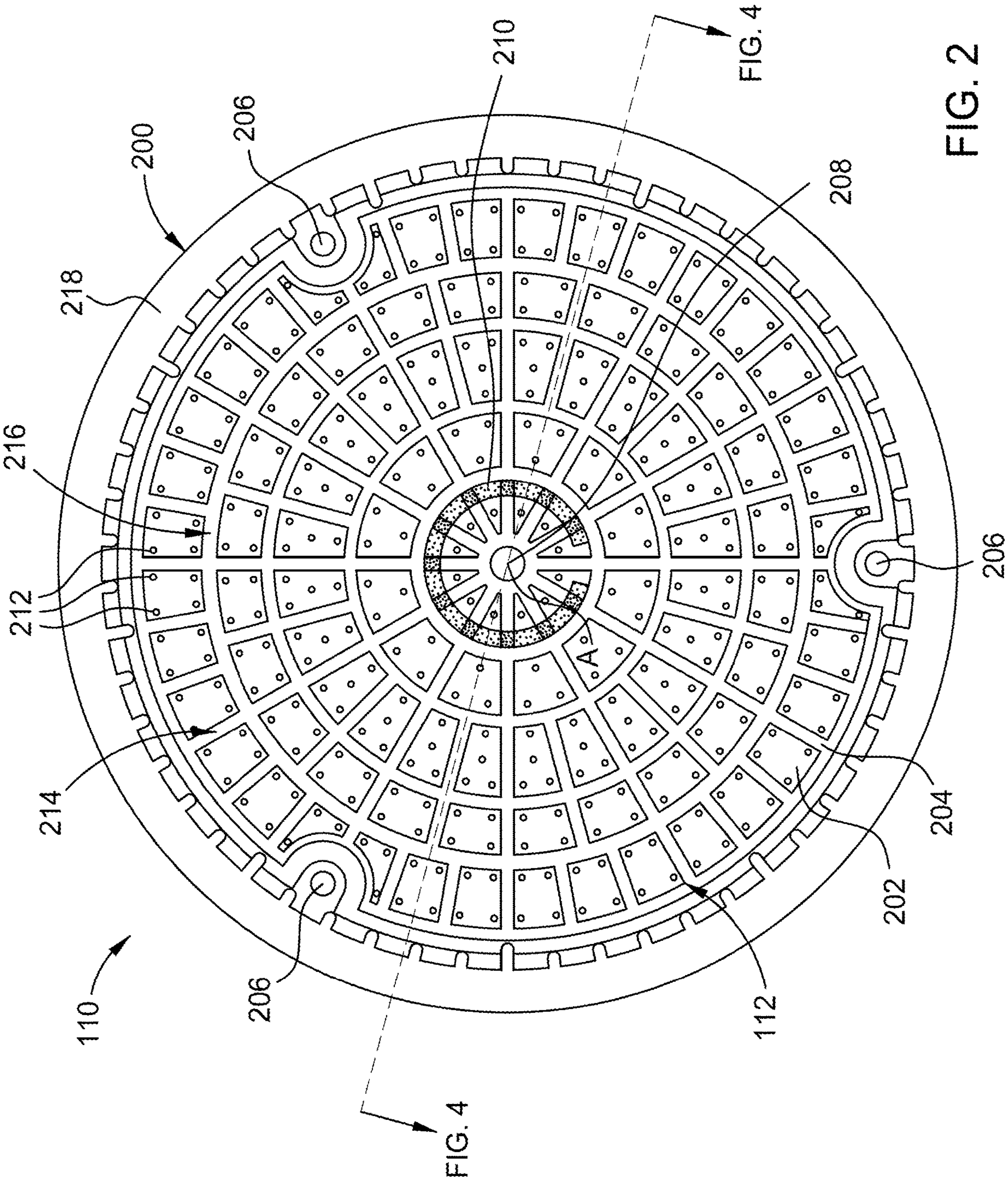
FIG. 2 is a schematic plan view of a section of an electrostatic chuck used within the PVD process chamber of FIG. 1, according to embodiments described herein.

FIG. 2 is a schematic plan view of a section of an electrostatic chuck 200 within a substrate support 110 within the PVD process chamber 100 of FIG. 1. The electrostatic chuck 200 is configured to chuck a substrate thereon and includes the support surface 112. The electrostatic chuck 200 includes a plurality of grooves 204, a plurality of lift pin openings 206, a central opening 208, a center tap 210, a plurality of dimples 212, a plurality of mesas 202, and an outer support ring 218 forming the support surface 112.

The plurality of grooves 204 include both radial grooves 214 and annular groove rings 216. The radial grooves 214 extend radially outward from a central axis A of the electrostatic chuck 200 and radially outward from the central opening 208. The radial grooves 214 are evenly spaced and extend to an inside edge of the outer support ring 218. The radial grooves 214 are radial indents and are linear. The radial grooves are formed in the support surface 112 and extend below the support surface 112. There are 4 to 20 radial grooves 214, such as 6 to 16 radial grooves 214, such as 10 to 14 radial grooves 214, such as 12 radial grooves 214. The annular groove rings 216 are concentric rings formed of formed in the support surface 112 and extending below the support surface 112 and are centered around the central axis A and the central opening 208. There are 2 to 10 annular groove rings 216, such as 3 to 8 annular groove rings 216, such as 4 to 6 annular groove rings 216, such as 5 annular groove rings 216. The radial grooves 214 intersect the annular groove rings 216, such that each of the radial grooves 214 intersects each of the annular groove rings 216.

The plurality of lift pin openings 206 are disposed radially outward of the annular groove rings 216. The plurality of lift pin openings 206 are formed through the full width of the electrostatic chuck 200. The lift pin openings 206 are disposed through the support surface 112. The lift pin openings 206 are evenly spaced and configured to allow a lift pin to pass therethrough. The lift pins are configured to raise and lower a substrate to position the substrate onto the support surface 112 or remove the substrate from the support surface 112. The lift pin openings 206 are disposed radially inward of the outer support ring 218.

The central opening 208 is a circular opening disposed in the center of the support surface 112, such that the central axis A passes through the middle of the central opening 208. The central opening 208 is configured to enable a gas flow through the electrostatic chuck 200. The central opening 208 has a diameter of about 4 mm to about 10 mm, such as about 5 mm to about 8 mm, such as about 6 mm to about 7 mm, such as about 6.5 mm to about 7 mm.

The center tap 210 is a ring centered around the central opening 208. The center tap 210 is at least a semicircular ring extending from the support surface 112, such that the center tap 210 is C-shaped and has an open end on one side of the ring. The center tap 210 is a conductive ring, such as a metal ring and is utilized to measure a bias voltage of a substrate disposed on top of the electrostatic chuck 200. The center tap 210 is utilized in embodiments wherein a bipolar-electrostatic chuck is utilized, such that the bipolar-electrostatic chuck has a first bias voltage applied to a first side and a second bias voltage on a second side and the support surface 112 is split in half. The center tap 210 is disposed between the first side and the second side and is configured to determine the difference between a first bias voltage of the first side and a second bias voltage of the second side. In some embodiments, the first side is at −500 Volts while the second side is at +500 Volts. The center tap 210 may be coupled to a controller and/or sensor. The controller reads a voltage differential of about 1000 Volts between the first side and the second side. The radial grooves 214 are disposed through the center tap 210. The top surface of the center tap 210 varies in height, such that where the radial grooves 214 pass through the center tap 210, the center tap 210 has a lower height compared to parts of the center tap 210 which do not have a radial groove 214 disposed therethrough. The center tap 210 is disposed radially inward of the innermost annular groove ring 216 as well as the outer support ring 218.

The plurality of mesas 202 are disposed on the support surface 112. The plurality of mesas 202 are portions of the support surface 112 which are disposed between the radial grooves 214 and the annular groove rings 216. The plurality of mesas 202 have planar top surfaces. Each of the mesas 202 may be referred to as a chucklet, such that the plurality of mesas 202 form a spacer layer which separates the substrate from an electrode disposed beneath the plurality of mesas 202. The mesas 202 are formed of a dielectric or ceramic material. The plurality of dimples 212 are protrusions extending from the support surface 112. Each of the plurality of dimples 212 extends from one of the plurality of mesas 202. The plurality of dimples are cylindrical protrusions. Each of the plurality of dimples is less than about 2 mm in diameter, such as less than about 1.5 mm in diameter, such as less than about 1 mm in diameter. The dimples 212 are configured to separate a bottom surface of the substrate from a top surface of each of the plurality of mesas 202. The dimples 212 are formed of an oxide or a nitride material and are configured to reduce the contact of a substrate with the ceramic or dielectric material of the mesas 202. In some examples, the dimples 212 are formed of a titanium nitride material. Other materials of the dimples 212 are also contemplated. There are dimples 212 scattered across the support surface 112 and radially inward of the outer support ring 218. There may be 20 or more dimples 212, such as 50 or more dimples 212, such as 100 or more dimples 212, such as 150 or more dimples 212, such as 200 or more dimples 212, such as 300 or more dimples 212.

The outer support ring 218 forms the outermost portion of the support surface 112. The outer support ring 218 is an annular ring disposed radially outward of each of the dimples, the radial grooves 214, and the annular groove rings 216. The outer support ring 218 is configured to support an outer edge of a substrate during semiconductor processing operations. The outer support ring 218 may form a partial or a full seal, such as a vacuum seal, between the backside of a substrate disposed thereon and a process volume of a process chamber, such as the PVD chamber 100. The outer support ring 218 has a height greater than the plurality of mesas 202. In some embodiments, the outer support ring 218 has a similar height to both of the plurality of dimples 212 and the center tap 210. In other embodiments, the outer support ring 218 has a greater height than either of the dimples 212 or the center tap 210, but the deflection of a substrate near the center of the substrate still enables contact of the substrate with the center tap 210 and the dimples 212.

The electrostatic chuck 200 is utilized for a variety of semiconductor processing operations, such as RIE, PVD, PEALD, or PECVD process operations. Within the RIE, PVD, PEALD, and PECVD process operations the plasma density is affected by the patterns of conduction traces and insulators on the chuck surface. Although the patterning on some semiconductor devices is within tolerable ranges, recent experimentation has shown increased prevalence of undesired patterning when utilizing the electrostatic chuck 200 during processing of optical devices. It is believed the use thinner and more optically sensitive substrate materials (e.g. quartz, glass, or dielectric materials) causes an increase in the presence of patterning on the substrate after plasma process operations. In some experiments, a chuck mark is able to be viewed on the substrate after processing, where the chuck mark corresponds to the center tap 210.

Figure 3:
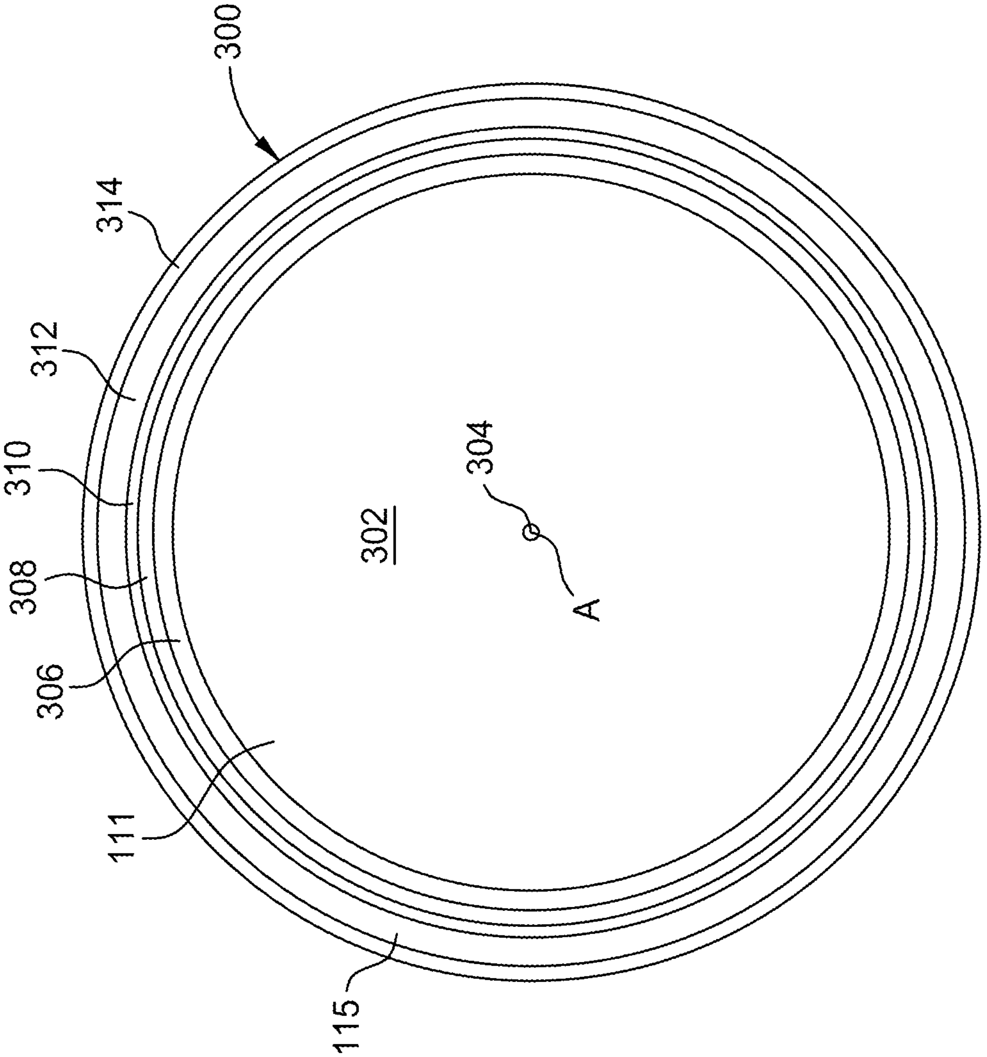
FIG. 3 is a schematic plan view of a cover plate assembly used within the PVD process chamber of FIG. 1, according to embodiments described herein.
Figure 4:
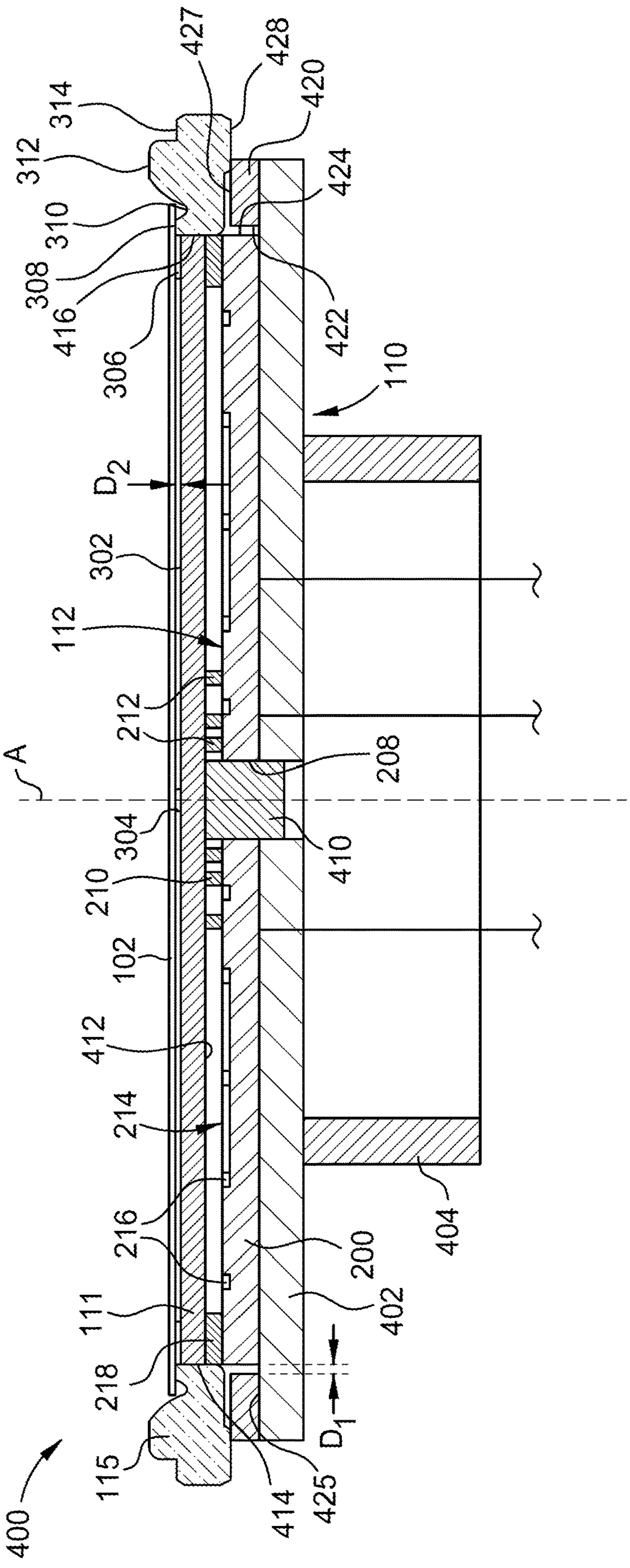
FIG. 4 is a schematic cross-sectional view of the substrate support assembly of FIG. 1, according to embodiments described herein.

FIG. 3 is a schematic plan view of a cover plate assembly 300 used within the PVD process chamber 100 of FIG. 1. The cover plate assembly 300 is placed on top of the substrate support 110 and over the electrostatic chuck 200. The cover plate assembly 300 includes the cover plate 111, the edge ring 115, and a spacer 420 (FIG. 4). The cover plate assembly 300 distributes charge accumulation on portions of a substrate placed on the cover plate assembly 300 relative to embodiments where the substrate is placed directly on the electrostatic chuck 200. The cover plate assembly 300 further improves process uniformity on the substrate by improving the uniformity of an electric field disposed through and above the substrate. The electric field is improved as features on the top surface of the electrostatic chuck 200 are at least partially hidden by the cover plate assembly 300. The edge ring 115 assists in controlling the process uniformity on the substrate and is raised to a desired position by the spacer 420.

The cover plate 111 is disposed radially inside of the edge ring 115. The cover plate 111 includes a top surface 302. The top surface 302 is a planar top surface. The cover plate 111 includes a central support 304 and a support ring 306. The central support 304 is a cylindrical extension extending from the center of the top surface 302, such that the central axis A of the cover plate assembly 300 and the cover plate 111 extends through the central support 304. The central support 304 extends outward from the top surface 302 and is configured to support a central portion of a substrate, such as the substrate 102. The central support 304 reduces bowing in the center of the substrate. Reducing bowing of the substrate is beneficial during processing of very thin substrates such as is used during manufacture of optical devices.

The support ring 306 forms the outermost portion of the cover plate 111. The support ring 306 is an annular ring disposed radially outward of the top surface 302 and the central support 304. The support ring 306 is configured to support an outer edge of a substrate during semiconductor processing operations. The support ring 306 may contact the backside of a substrate disposed thereon, and separates the substrate from the central portion of the top surface 302 and supports an outer portion of the substrate. The support ring 306 has a height greater than the top surface 302.

The edge ring 115 is disposed around the cover plate 111 and circumscribes the top surface 302. The edge ring 115 is configured to assist in shaping a plasma formed above a substrate and guides deposition on the top surface of the substrate. The edge ring 115 includes an edge support surface 308, an annular indent 310, a top edge ring surface 312, and a stepped outer surface 314. The edge support surface 308 is an annular surface configured to be disposed beneath an edge of a substrate, such as the substrate 102. The edge support surface 308 is a horizontal surface and is parallel with the top surface 302. The edge support surface 308 may be parallel with and coplanar with the top surface 302 and the support ring 306 of the cover plate 111.

The annular indent 310 is formed radially outward from the edge support surface 308 of the edge ring 115. The annular indent 310 is a groove formed in the top surface of the edge ring 115. The annular indent 310 extends outward from the edge support surface 308 and below the edge support surface 308, such that the annular indent 310 is disposed from the top edge ring surface 312 of the edge ring 115 and towards a bottom edge ring surface 428 (FIG. 4). The annular indent 310 is shaped to assist in preventing backside deposition on the substrate.

The top edge ring surface 312 is a planar surface disposed radially outward from the annular indent 310, such that the top edge ring surface 312 extends from the outer edge of the annular indent 310. The top edge ring surface 312 is parallel to the edge support surface 308. The top edge ring surface 312 is disposed above the edge support surface 308 and the support ring 306 of the cover plate 111. The top edge ring surface 312 is configured to be above a top surface of a substrate and helps guide plasma towards the surface of the substrate.

The stepped outer surface 314 is disposed radially outward from the top edge ring surface 312. A vertical or angled surface extends between the stepped outer surface 314 and the top edge ring surface 312. The stepped outer surface 314 is disposed below the top edge ring surface 312. The stepped outer surface 314 is a horizontal surface and parallel to the top edge ring surface 312 and the edge support surface 308.

FIG. 4 is a schematic cross-sectional view of the substrate support assembly 400 of FIG. 1. The substrate support assembly 400 includes each of the substrate support 110, the cover plate 111, the edge ring 115, and the spacer 420. The assembled cover plate 111, edge ring 115, and spacer 420 are configured to assist in the distribution of charge along a substrate to reduce the uneven deposition on the substrate from plasma processes within the PVD chamber 100.

The substrate support 110 includes a support shaft 404 and a base layer 402. The electrostatic chuck 200 is positioned on top of the base layer 402 of the support shaft 404. The base layer 402 includes a top base surface 425. The top base surface 425 is configured to support the electrostatic chuck 200, the edge ring 115, and the spacer 420. The top base surface 425 extends radially outward of an outer chuck surface 424. The electrostatic chuck 200 rests on top of the top base surface 425 and the base layer 402. The spacer 420 is disposed on the top base surface 425 and the base layer 402 and around the outer chuck surface 424 of the electrostatic chuck 200. The edge ring 115 is disposed on a top spacer surface 427 of the spacer 420.

An inside spacer surface 422 is an innermost surface of the spacer 420 and is disposed radially outward of the outer chuck surface 424. The inside spacer surface 422 is a first distance $D_1$ from the outer chuck surface 424. The first distance $D_1$ is about 0.1 mm to about 1.5 mm, such as about 0.25 mm to about 1 mm, such as about 0.4 mm to about 0.6 mm. The first distance $D_1$ accounts for thermal expansion and other deformations of both of the spacer 420 and the electrostatic chuck 200. The first distance $D_1$ is small enough to reduce movement of the spacer 420 relative to the electrostatic chuck 200 during processing.

The cover plate 111 is disposed on top of the electrostatic chuck 200. The cover plate 111 includes an outer cover surface 414 adjacent to an inner edge ring surface 416. The outer cover surface 414 and the inner edge ring surface 416 interlock to prevent movement of the cover plate 111 and the edge ring 115 relative to one another during processing. The cover plate 111 rests directly on top of one or more of the outer support ring 218, the center tap 210 or the plurality of dimples 212. The cover plate 111 further includes an alignment protrusion 410 extending from a bottom cover plate surface 412. The alignment protrusion 410 is a cylindrical protrusion extending from a center of the bottom cover plate surface 412, such that the central axis A passes through the alignment protrusion 410. The alignment protrusion 410 is configured to extend into the central opening 208 of the electrostatic chuck 200 and the substrate support 110. The alignment protrusion 410 is configured to hold the cover plate 111 in place on the electrostatic chuck 200 during movement of the electrostatic chuck 200. The alignment protrusion 410 has a cross-sectional diameter which is similar to the cross-sectional diameter of the central opening 208. In some embodiments, the cross-sectional diameter of the alignment protrusion 410 is about 4 mm to about 10 mm, such as about 5 mm to about 8 mm, such as about 6 mm to about 7 mm, such as about 6.5 mm to about 7 mm.

The height of the support ring 306 is a second distance $D_2$. The second distance $D_2$ is about 0.2 mm to about 0.8 mm, such as about 0.3 mm to about 0.7 mm, such as about 0.4 mm to about 0.6 mm, such as about 0.45 mm to about 0.55 mm. The height of the central support 304 is also the second distance $D_2$, such that the height of the central support 304 is about 0.2 mm to about 0.8 mm, such as about 0.3 mm to about 0.7 mm, such as about 0.4 mm to about 0.6 mm, such as about 0.45 mm to about 0.55 mm. The diameter of the central support 304 is about 1 mm to about 5 mm, such as about 1.5 mm to about 4 mm, such as about 2 mm to about 3 mm, such as about 2.4 mm to about 2.6 mm. The height of both the support ring 306 and the central support 304 are configured to reduce bowing of a substrate disposed thereon and control which portions of the substrate have direct contact with the top surface 302 of the cover plate 111. The total thickness of the cover plate 111 from a bottom of the alignment protrusion 410 to a top surface of the support ring 306 is about 2 mm to about 10 mm, such as bout 3 mm to about 8 mm, such as about 4 mm to about 7 mm, such as about 5 mm to about 6 mm. The thickness of the cover plate 111 from the bottom cover plate surface 412 to the top surface 302 is about 1 mm to about 3 mm, such as about 1.5 mm to about 2.5 mm, such as about 1.8 mm to about 2.2 mm, such as about 1.9 mm to about 2.1 mm.

Figure 5B:
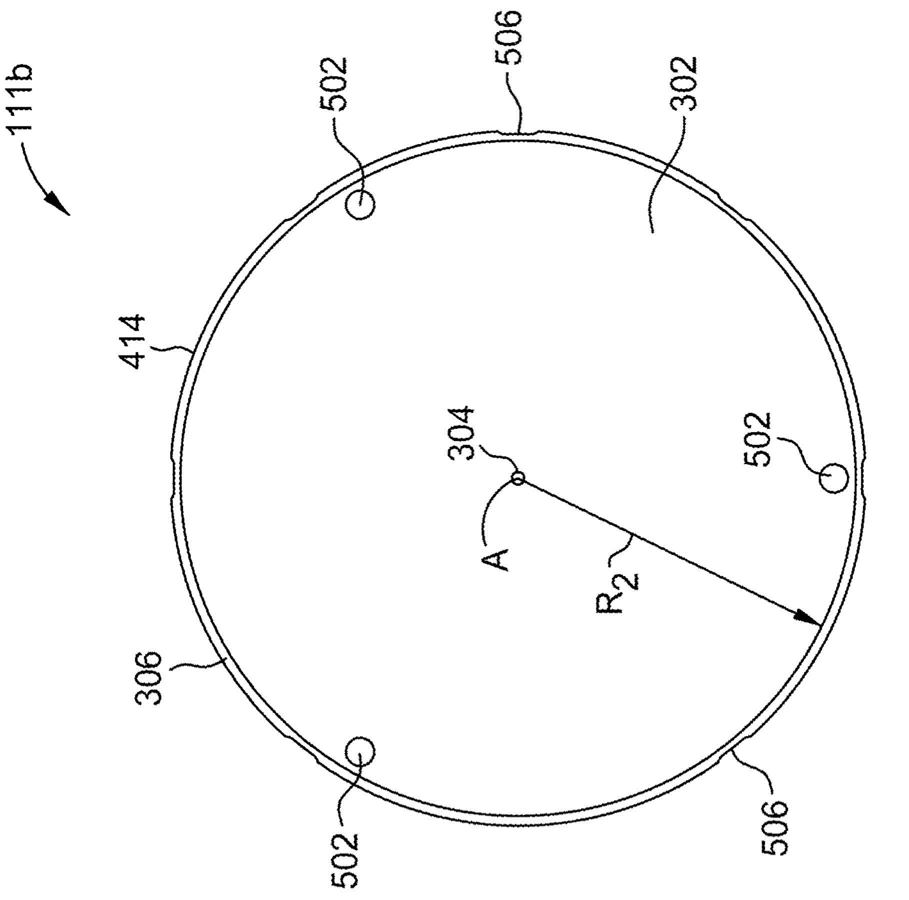
FIGS. 5A and 5B are schematic plan views of cover plates used in the substrate support assembly of FIG. 4, according to embodiments described herein.
Figure 5A:
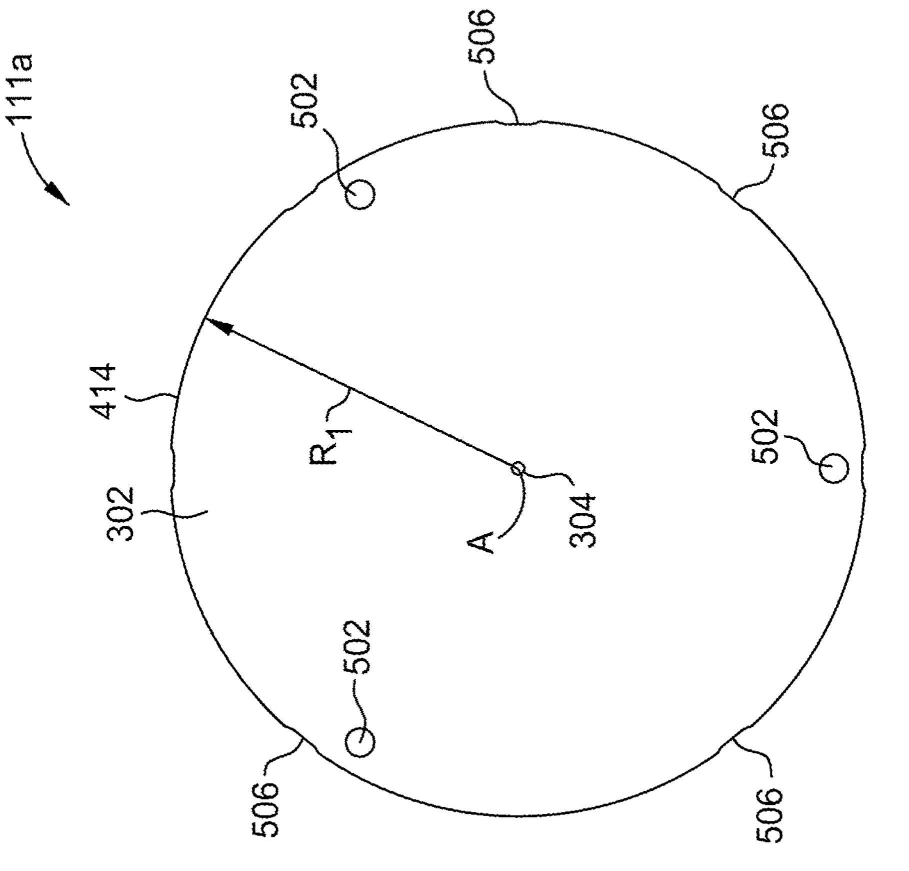

FIGS. 5A and 5B are schematic plan views of cover plates 111*a*, 111*b* used in the substrate support assembly 400 of FIG. 4. Each of the cover plates 111*a*, 111*b* may be used in place of the cover plate 111 described in FIG. 1, FIG. 2, and FIG. 4. Both of the cover plates 111*a*, 111*b* include the alignment protrusion 410 extending from a bottom cover plate surface 412. Both of the cover plates 111*a*, 111*b* further include the central support 304 extending from the top surface 302 and an outer cover surface 414.

A plurality of lift pin holes 502 are formed through the cover plate. The lift pin holes 502 are configured to align with the lift pin openings 206 disposed through the electrostatic chuck 200 of FIG. 2. The plurality of lift pin holes 502 are disposed evenly about the central axis A. The plurality of lift pin holes 502 includes 3 or more lift pin holes 502, such as 3 lift pin holes.

A plurality of notches 506 are formed in the outer cover surface 414. The plurality of notches 506 are indents in the outer cover surface 414. The plurality of notches 506 enable the cover plates 111*a*, 111*b* to be interlocked with an edge ring, such as the edge ring 115. In some embodiments, the top surface of the electrostatic chuck 200 also includes notches which match the notches 506 of the cover plates 111*a*, 111*b*. The plurality of notches 506 are spaced at least degrees apart from one another as measured from the central axis A. In some embodiments, the plurality of notches 506 are spaced at least 50 degrees apart. There are two or more notches 506, such as three or more notches 506, such as or more notches 506, such as 6 or more notches 506, such as 7 notches. In some embodiments, the notches 506 are asymmetrically spaced along the outer cover surface 414.

The radius of the cover plates 111*a*, 111*b* is a first radius $R_1$. The first radius $R_1$ is the radius from the central axis A to the outer cover surface 414. The first radius $R_1$ is about 90 mm to about 99 mm, such as about 94 mm to about 98 mm, such as about 96 mm to about 97 mm. Each of the notches 506 is indented from the outer cover surface 414 by about 0.5 mm to about 1.5 mm, such as about 0.7 mm to about 1.0 mm, such as about 0.8 mm to about 0.9 mm. The top surface 302 of the cover plates 111*a*, 111*b* is planar and unbroken from a radial distance of at least 3 mm to about 80 mm from the central axis A, such as about 2 mm to about 85 mm. The cover plates 111*a*, 111*b* are formed of a metal material. The metal material may be an aluminum or a stainless steel material.

FIG. 5A illustrates a first cover plate 111*a* in which a support ring 306 is not utilized. The first cover plate 111*a* therefore does not have a sealing ring which seals with a substrate around the outer edge of the first cover plate 111*a*. However, the second cover plate 111*b* of FIG. 5B does includes the support ring 306 around an outer portion of the first cover plate 111*a*. The support ring 306 extends from the top surface 302 and forms a lip. The support ring 306 assists in forming a seal between the second cover plate 111*b* and a substrate disposed thereon. An inner edge of the support ring 306 has a second radius $R_2$. The second radius $R_2$ is about 90 mm to about 97 mm, such as about 91 mm to about 96 mm, such as about 92 mm to about 95 mm, such as about 93 mm to about 94 mm, such as about 93.5 mm to about 94 mm. The difference between the first radius $R_1$ and the second radius $R_2$ is about 1 mm to about 5 mm, such as about 2 mm to about 4 mm, such as about 2 mm to about 3 mm.

Figure 6:
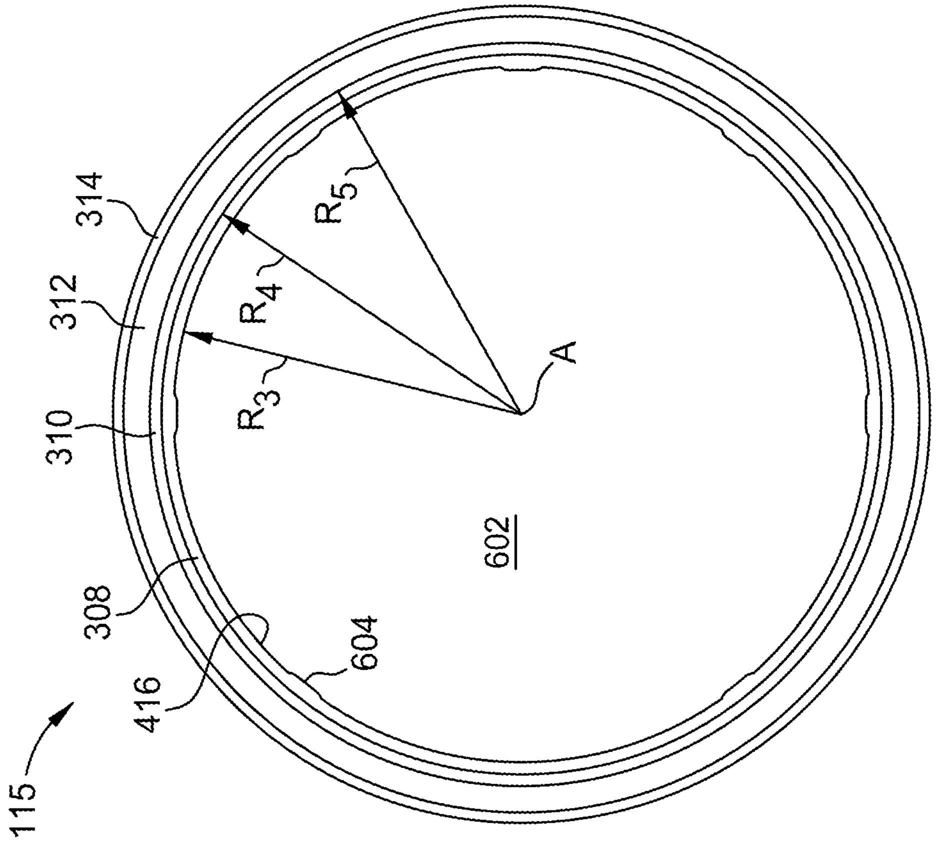
FIG. 6 is a schematic plan view of an edge ring used in the substrate support assembly of FIG. 4, according to embodiments described herein.

FIG. 6 is a schematic plan view of an edge ring 115 used in the substrate support assembly 400 of FIG. 4. The edge ring 115 further includes a central opening 602 and a plurality of protrusions 604 extending radially inward from the inner edge ring surface 416. The protrusions 604 are configured to interlock with the plurality of notches 506 in the cover plates 111*a*, 111*b*.

The protrusions 604 therefore are spaced at least 45 degrees apart from one another as measured from the central axis A. In some embodiments, the plurality of protrusions 604 are spaced at least 50 degrees apart. There are two or more protrusions 604, such as three or more protrusions 604, such as 5 or more protrusions 604, such as 6 or more protrusions 604, such as 7 protrusions 604. In some embodiments, the protrusions 604 are asymmetrically spaced along the inner edge ring surface 416. Each of the protrusions 604 extends from the inner edge ring surface 416 by about 0.5 mm to about 1.5 mm, such as about 0.7 mm to about 1.0 mm, such as about 0.8 mm to about 0.9 mm.

The inner edge ring surface 416 has a third radius $R_3$. The third radius $R_3$ is similar to the first radius $R_1$. The third radius $R_3$ is about 90 mm to about 100 mm, such as about 95 mm to about 99 mm, such as about 96 mm to about 98 mm, such as about 97 mm to about 98 mm. The third radius $R_3$ is configured to enable interlocking between the cover plates 111*a*, 111*b* and the edge ring 115. The outer edge of the edge support surface 308 has a fourth radius $R_4$. The fourth radius $R_4$ is about 95 mm to about 100 mm, such as about 96 mm to about 100 mm, such as about 97 mm to about 99 mm, such as about 98 mm to about 99 mm, such as about 98.5 mm to about 99 mm. The difference between the third radius $R_3$ and the fourth radius $R_4$ defines the width of the edge support surface 308. The edge support surface 308 therefore has a width of about 3.0 mm to about 0.5 mm, such as about 2.0 mm to about 1.0 mm, such as about 1.8 mm to about 1.3 mm, such as about 1.6 mm to about 1.4 mm. The inner edge of the top edge ring surface 312 has a fifth radius $R_5$. The fifth radius $R_5$ is about 103 mm to about 110 mm, such as about 104 mm to about 109 mm, such as about 105 mm to about 108 mm, such as about 106 mm to about 107 mm. The fifth radius $R_5$ is configured to be greater than an outer radius of a substrate which is processed utilizing the edge ring 115 and one of the cover plates 111*a*, 111*b*.

The edge ring 115 is formed of an insulating material, such as a ceramic material. The ceramic material of the edge ring 115 may be an oxide or a nitride, such as an aluminum oxide or aluminum nitride.

Figure 7:
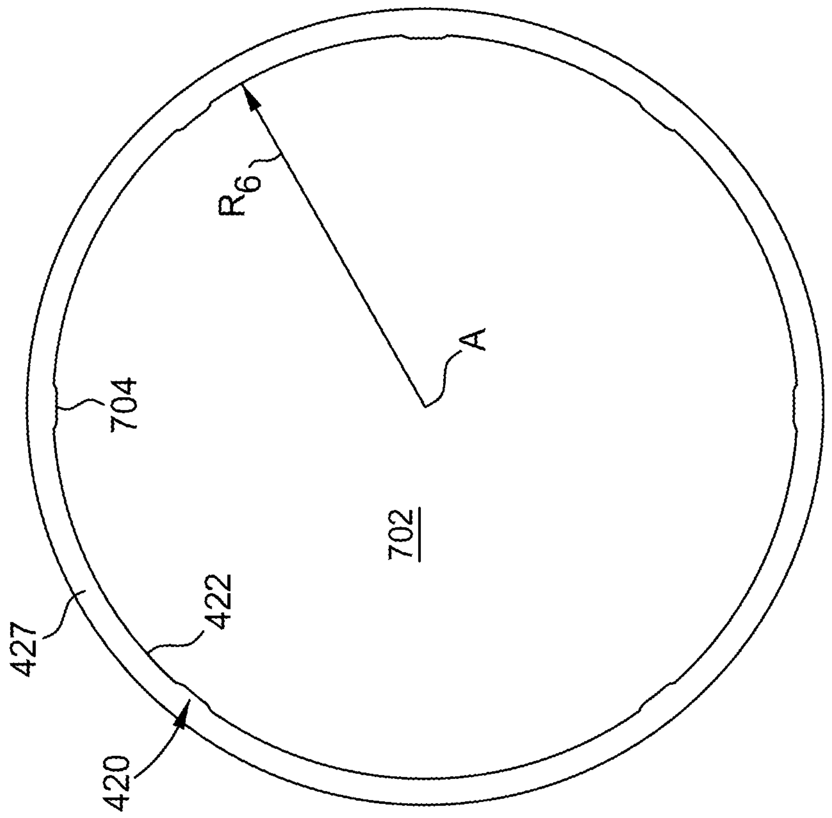
FIG. 7 is a schematic plan view of a spacer used in the substrate support assembly of FIG. 4, according to embodiments described herein.

FIG. 7 is a schematic plan view of a spacer 420 used in the substrate support assembly 400 of FIG. 4. The spacer 420 is utilized to lift the edge ring 115 and separate the edge ring 115 from the top base surface 425 (FIG. 4). The edge ring 115 includes the inside spacer surface 422. The inside spacer surface 422 is configured to have a larger radius than the outer chuck surface 424. The inside spacer surface 422 is an annular surface and forms the central spacer opening 702. The inside spacer surface 422 has a sixth radius $R_6$. The sixth radius $R_6$ is similar to the third radius $R_3$. The sixth radius $R_6$ is about 90 mm to about 100 mm, such as about 95 mm to about 99 mm, such as about 96 mm to about 98 mm, such as about 97 mm to about 98 mm. The sixth radius $R_6$ is configured to enable interlocking between the cover plates 111*a*, 111*b* and the spacer 420.

The spacer 420 further includes a plurality of protrusions 704 extending radially inward from the inner spacer surface 422. The protrusions 704 are configured to interlock with the plurality of notches 506 in the cover plates 111*a*, 111*b*. The protrusions 704 therefore are spaced at least 45 degrees apart from one another as measured from the central axis A. In some embodiments, the plurality of protrusions 704 are spaced at least 50 degrees apart. There are two or more protrusions 704, such as three or more protrusions 704, such as 5 or more protrusions 704, such as 6 or more protrusions 704, such as 7 protrusions 704. In some embodiments, the protrusions 704 are asymmetrically spaced along the inner spacer surface 422. Each of the protrusions 704 extends from the inner spacer surface 422 by about 0.5 mm to about 1.5 mm, such as about 0.7 mm to about 1.0 mm, such as about 0.8 mm to about 0.9 mm. The spacer 420 is formed of an insulating material, such as a ceramic material. The ceramic material of the spacer 420 may be an oxide or a nitride, such as an aluminum oxide or aluminum nitride. The spacer 420 has a height of about 1 mm to about 5 mm, such as about 2 mm to about 4 mm, such as about 2 mm to about 3 mm.

The cover plates 111, 111*a*, 111*b* may be utilized in addition to the edge ring 115, the spacer 420, and the electrostatic chuck 200 to obtain better process results when performing plasma containing process operations on substrates for the formation of optical devices. The cover plates 111, 111*a*, 111*b* may be retrofit onto an existing electrostatic chuck 200 quickly and with little process chamber downtime. The cover plates 111, 111*a*, 111*b* enable the use of the electrostatic chuck 200 for processing of optical devices while improving film uniformity on the optical device and reducing the presence of a chuck mark on a central portion of the substrate.

While the foregoing is directed to embodiments of the present disclosure, other and further embodiments of the disclosure may be devised without departing from the basic scope thereof, and the scope thereof is determined by the claims that follow.

What is claimed is:

1. A substrate support assembly, configured for use in a semiconductor processing chamber, comprising:
- a substrate support comprising a support surface comprising:
  - a plurality of grooves;
  - a central opening;
  - a center tap;
  - a plurality of dimples; and
  - a plurality of lift pin openings;
- a cover plate disposed over the support surface, the cover plate comprising:
  - a top surface;
  - a bottom surface in contact with the plurality of dimples;
  - an alignment protrusion extending from the bottom surface and into the central opening; and
  - a plurality of openings formed from the top surface to the bottom surface and aligned with the plurality of lift pin openings; and
- an edge ring disposed around the cover plate.

2. The substrate support assembly of claim 1, further comprising a spacer surrounding the support surface.

3. The substrate support assembly of claim 1, wherein the top surface of the cover plate further comprises a support ring at an outmost portion of the cover plate and centered around a central axis of the substrate support, wherein the central axis passes through the center of the central opening.

4. The substrate support assembly of claim 3, the cover plate further comprising a central support extending from the top surface of the cover plate such that the central axis extends through the central support.

5. The substrate support assembly of claim 1, further comprising:
- a plurality of mesas disposed on the support surface between the plurality of grooves, wherein the plurality of dimples extend from the plurality of mesas.

6. The substrate support of claim 5, wherein:
- the mesas comprise a dielectric or ceramic material; and
- the dimples are formed from an oxide or a nitride material.

7. The substrate support of claim 6, wherein the outer surface of the cover plate comprises a plurality of notches and the inner surface of the edge ring comprises a plurality of protrusions interlocking with the plurality of notches.

8. The substrate support of claim 1, wherein the top surface of the cover plate is planar and unbroken from a radial distance of about 3 mm to about 80 mm from a central axis of the cover plate.

9. The substrate support of claim 1, wherein the edge ring and the substrate support comprise ceramic materials.

10. A substrate support assembly, configured for use in a semiconductor processing chamber, comprising:
- a substrate support comprising a support surface comprising:
  - a central opening;
  - a plurality of grooves;
  - a center tap;
  - a plurality of mesas disposed on the support surface between the plurality of grooves;
  - a plurality of dimples extending from the plurality of mesas; and
  - a plurality of lift pin openings;
- a cover plate, comprising:
  - a top surface;
  - a bottom surface in contact with the plurality of dimples;
  - an alignment protrusion extending from the bottom surface through a central axis of the cover plate and extending into the central opening of the substrate support;
  - a plurality of lift pin openings formed from the top surface to the bottom surface and evenly spaced around the central axis; and a central support extending above the top surface and through the central axis, wherein the top surface of the cover plate is planar and unbroken from a radial distance of about 3 mm to about 80 mm from a central axis of the cover plate.

11. The cover plate of claim 10, wherein the alignment protrusion is cylindrical and has a cross section with a diameter of about 2 mm to about 10 mm and the central support extends about 0.1 mm to about 1 mm above the top surface.

12. The cover plate of claim 11, further comprising an outer surface connecting the top surface and the bottom surface, wherein the outer surface further comprises a plurality of notches formed therein.

13. The cover plate of claim 11, wherein the central support has a support diameter of about 1 mm to about 5 mm.

14. The cover plate of claim 10, wherein the cover plate further comprises a support ring extending from the top surface and centered around the central axis.

15. The cover plate of claim 14, wherein an inner radius of the support ring is about 90 mm to about 99 mm and an outer radius of the support ring is about 90 mm to about 97 mm.

16. A substrate support assembly, configured for use in a semiconductor processing chamber, comprising:
- a substrate support comprising a support surface comprising:
  - a central opening;
  - a plurality of grooves;
  - a center tap;
  - a plurality of mesas disposed on the support surface between the plurality of grooves;
  - a plurality of dimples extending from the plurality of mesas; and
  - a plurality of lift pin openings;
- a cover plate assembly, comprising:
  - a cover plate comprising:
    - a top surface;
    - a bottom surface in contact with the plurality of dimples;
    - an outer surface connecting the top surface and the bottom surface;
    - an alignment protrusion extending from the bottom surface through a central axis of the cover plate and extending into the central opening;
  - a plurality of lift pin openings formed from the top surface to the bottom surface and evenly spaced around the central axis; and
  - a central support extending above the top surface and through the central axis, wherein the top surface of the cover plate is planar and unbroken from a radial distance of about 3 mm to about 80 mm from a central axis of the cover plate;
- an edge ring disposed around the outer surface of the cover plate; and
- a spacer disposed underneath the edge ring and around the outer surface of the substrate support.

17. The cover plate assembly of claim 16, wherein the edge ring and the spacer are a ceramic materials and the cover plate is a metal material and the central support extends about 0.1 mm to about 1 mm above the top surface.

18. The cover plate assembly of claim 17, wherein the spacer has a height of about 1 mm to about 5 mm.

19. The cover plate assembly of claim 17, wherein the outer surface of the cover plate comprises a plurality of notches and an inner surface of the edge ring comprises a plurality of protrusions interlocking with the plurality of notches.

20. The cover plate assembly of claim 16, wherein the cover plate further comprises a support ring extending from the top surface and centered around the central axis.

* * * * *